United States Patent
Gerber

(10) Patent No.: US 10,510,643 B2
(45) Date of Patent: Dec. 17, 2019

(54) SEMICONDUCTOR PACKAGE WITH LEAD FRAME AND RECESSED SOLDER TERMINALS

(71) Applicant: TEXAS INSTRUMENTS INCORPORATED, Dallas, TX (US)

(72) Inventor: Mark Allen Gerber, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/978,497

(22) Filed: May 14, 2018

(65) Prior Publication Data
US 2018/0261531 A1    Sep. 13, 2018

Related U.S. Application Data

(63) Continuation of application No. 14/453,650, filed on Aug. 7, 2014, now Pat. No. 9,978,667.
(Continued)

(51) Int. Cl.
*H01L 23/495* (2006.01)
*H01L 21/48* (2006.01)
*H01L 23/00* (2006.01)

(52) U.S. Cl.
CPC ...... *H01L 23/4952* (2013.01); *H01L 21/4825* (2013.01); *H01L 23/49548* (2013.01); *H01L 24/45* (2013.01); *H01L 24/48* (2013.01); *H01L 24/85* (2013.01); *H01L 2224/45144* (2013.01); *H01L 2224/45147* (2013.01); *H01L 2224/48247* (2013.01); *H01L 2224/48472* (2013.01); *H01L 2224/48639* (2013.01); *H01L 2224/48839* (2013.01); *H01L 2224/73265* (2013.01); *H01L 2224/85439* (2013.01); *H01L 2924/00012* (2013.01); *H01L 2924/12042* (2013.01); *H01L 2924/181* (2013.01); *H01L 2924/1815* (2013.01)

(58) Field of Classification Search
CPC ... H01L 23/495–49586; H01L 23/498–49894; H01L 21/4814–4842; H01L 21/4853; H01L 23/3107; H01L 2224/48247–48248; H01L 23/3144; H01L 23/315; H01L 23/3185; H01L 2924/18165; H01L 2924/18301
See application file for complete search history.

(56) References Cited

U.S. PATENT DOCUMENTS 5,640,052 A    6/1997  Tsukamoto
6,001,671 A   12/1999  Fjelstad
(Continued)

*Primary Examiner* — Younes Boulghassoul
(74) *Attorney, Agent, or Firm* — Dawn Jos; Charles A. Brill; Frank D. Cimino

(57) ABSTRACT

A semiconductor device (100) comprising a leadframe (120) having an assembly pad (121) in a first horizontal plane (180), the pad's first surface (121a) with a semiconductor chip (110) attached; further a plurality of leads (122) in a parallel second horizontal plane (190) offset from the first plane in the direction of the attached chip, the leads having a third surface (122a) with bonding wires, and an opposite fourth surface (122b); a package (140) encapsulating leadframe, chip, and wires, the package having a fifth surface (140a) parallel to the first and second planes; a plurality of recess holes (150) in the package, each hole stretching from the fifth surface to the fourth surface of respective leads; and solder (160) filling the recess holes, the solder attached to the fourth lead surface and extending to the fifth package surface.

20 Claims, 3 Drawing Sheets

Related U.S. Application Data

(60) Provisional application No. 61/863,246, filed on Aug. 7, 2013.

(56) References Cited

U.S. PATENT DOCUMENTS

| | | | |
|---|---|---|---|
| 6,365,976 B1 * | 4/2002 | Carter, Jr. | H01L 21/4853 257/779 |
| 6,528,877 B2 | 3/2003 | Ernst et al. | |
| 6,995,459 B2 | 2/2006 | Lee et al. | |
| 7,064,001 B2 | 6/2006 | Kazama et al. | |
| 7,948,066 B2 * | 5/2011 | Do | H01L 21/4832 257/666 |
| 8,089,145 B1 * | 1/2012 | Kim | H01L 21/4842 257/666 |
| 8,089,159 B1 | 1/2012 | Park et al. | |
| 8,115,285 B2 | 2/2012 | Chen et al. | |
| 8,134,242 B2 * | 3/2012 | Camacho | H01L 21/568 257/730 |
| 8,937,379 B1 * | 1/2015 | Do | H01L 23/49541 257/666 |
| 2001/0035569 A1 | 11/2001 | Shibata | |
| 2003/0015780 A1 | 1/2003 | Kang et al. | |
| 2003/0102538 A1 * | 6/2003 | Paulus | H01L 21/56 257/666 |
| 2004/0097017 A1 * | 5/2004 | Shimanuki | H01L 21/4832 438/124 |
| 2007/0181983 A1 | 8/2007 | Takai et al. | |
| 2007/0222040 A1 * | 9/2007 | Lin | H01L 21/4828 257/666 |
| 2007/0241445 A1 * | 10/2007 | Ikenaga | H01L 21/4828 257/693 |
| 2008/0303134 A1 * | 12/2008 | Li | H01L 21/4832 257/691 |
| 2009/0166824 A1 | 7/2009 | Do et al. | |
| 2011/0156252 A1 * | 6/2011 | Lin | H01L 21/568 257/738 |
| 2011/0260310 A1 * | 10/2011 | Jow | H01L 21/4832 257/676 |
| 2012/0153449 A1 | 6/2012 | Chou | |
| 2012/0211889 A1 * | 8/2012 | Edwards | H01L 21/4821 257/746 |
| 2013/0241041 A1 | 9/2013 | Yu et al. | |

\* cited by examiner

SEMICONDUCTOR PACKAGE WITH LEAD FRAME AND RECESSED SOLDER TERMINALS

CROSS REFERENCE TO RELATED APPLICATION

This application is a continuation of application Ser. No. 14/453,650, filed Aug. 7, 2014, which claims the benefit of Provisional Patent Application No. 61/863,246, filed on Aug. 7, 2013, the contents of which are herein incorporated by reference in its entirety.

FIELD

Embodiments of the invention are related in general to the field of semiconductor devices and processes, and more specifically to the structure and fabrication method of semiconductor No-Lead packages with recessed terminals for more massive solder connections.

DESCRIPTION OF RELATED ART

The structure of contact pad metallizations and solder bumps for connecting integrated circuit (IC) chips to semiconductor packages or outside parts, as well as the thermomechanical stresses and reliability risks involved, have been described in a series of detailed publications, especially by IBM researchers (1969). During and after assembly of the IC chip to an outside part by solder reflow and then during device operation, significant temperature differences and temperature cycles appear between semiconductor chip and the substrate. The reliability of the solder joint is strongly influenced by the coefficients of thermal expansion (CTE) of the semiconductor material and the substrate material. For example, there is more than one order of magnitude difference between the coefficients of thermal expansion of silicon and FR-4 and laminated boards. This difference causes thermomechanical stresses, which the solder joints have to absorb. Detailed calculations involving the optimum height and volume of the solder connection and the expected onset of fatigue and cracking proposed a number of solder design solutions.

The fabrication methods and reliability problems involving flip-chips re-appear in somewhat modified form for ball-grid array type packages and chip-scale and chip-size packages, which may be attached directly to a printed circuit board (PCB), or alternatively, coupled to a second interconnection surface such as an interposer. Attaching the ball grid array to the next interconnect is carried out by aligning the solder bumps or balls on the package to contact pads on the interconnection and then performing a solder reflow operation. During the reflow, the bumps or balls liquefy and make a bond to the next interconnect level which has pads or traces to receive the solder. Following the solder reflow step, a polymeric underfill is often used between the package and the interposer (or PCB) to alleviate mechanical stress caused by the mismatch in the coefficients of thermal expansion (CTE) between the package, the interposer, if any, and the PCB. Many reliability problems occur due to the stress placed on the solder bumps or balls when the assembly is cycled from hot to cool during operation.

The thermomechanical stress problems experienced at solder joints in ball-grid array devices re-appear in devices, which use QFN/SON-type leadframes. The name of these leadframes (Quad Flat No-lead, Small Outline No-lead) indicates that the leads do not have cantilevered leads, but flat leads, which are typically arrayed along the periphery of the packaged device. The metal of the leads is connected by solder material to the metal of respective contact pads of the external part. Even when the solder joints are not formed by solder balls but rather by solder layers, the nature of the thermomechanical stress at the joints derives from the mismatch of the coefficients of thermal expansion among the various materials. When plastic-packaged semiconductor devices with QFN/SON-type leadframes, attached to externals parts by solder balls or solder layers, are subjected to accelerating reliability tests such as temperature cycling, it is known that units may fail due to stress-induced microcracks through the solder joints. The stress originates from the differences of the coefficients of thermal expansion between the devices and external parts such as pronted circuit boards.

In a recent effort to mitigate stress and reduce microcracks in solder joints, it has been proposed to manufacture leadframes with grooves in those leads on the package surface, which face externals boards at the time of solder attachment; the grooves in the leads are intended to enlarge the solderable flat lead surface and to provide a non-planar single contact surface that make it difficult for shear stresses to separate the metallic interfaces. After assembling chips on the pads of a leadframe strip and tying the chips to the leads, the strip is encapsulated in a packaging compound, which leaves the grooves un-encapsulated. The grooves are then filled with solder. Thereafter, the strip is singulated by a sawing technique. At the time of solder attachment, the pre-filled solder in the grooves is expected to reflow and mix with the new solder to form a larger attach area for the solder joint.

In another recent effort to increase the stress tolerance of solder joints, the solderable surfaces of leads on the package outside are to be enlarged by micromilling grooves into the package compound adjacent to the lead sidewalls, thereby exposing additional solderable lead surfaces along the lead sidewalls, which can be adhered to during solder attachment.

SUMMARY

Failure analysis of microcracks in solder joints of semiconductor devices with QFN/SON-type leadframes revealed that solder cracks typically originate in the region of high stress concentration especially in conjunction with solder necking and as a consequence of insufficient amounts of solder. Compressive and tensile stresses have been found to be particularly high in the corner regions of large-sized packages of rectangular cross section.

Applicant solved the problems of solder necking as well as insufficient solder amount, when he discovered a low-cost methodology to create reservoirs of massive amounts of solder without enlarging the footprint of the leads by recessing the leads from the package surface and opening up holes, which connect each recessed lead to the surface. The holes are pre-filled with solder, thus providing an increased amount of solder; the solder is attached to the leads, especially when they have been coined to enlarge the solderable surface, and will mix with external solder in the process of attaching the device to an external board. The improved volume of solder at each package joint will take up more thermomechanical stress during use while keeping the overall package height low.

One embodiment of the invention applies recessed leads with solder-filled holes to plastic packaged semiconductor devices with QFN/SON-type leadframes, which have been metallurgically prepared with solderable surfaces, for instance by plating consecutive layers of nickel, palladium, and gold on the base metal surfaces. The leadframes have an assembly pad in a first horizontal plane. The pad has a first surface, onto which a semiconductor chip has been attached, and an opposite second surface. The leadframe further has a plurality of leads in a parallel second horizontal plane, which is offset from the first plane in the direction of the attached chip. The offset is preferably achieved by stamping. The leads have a third surface with bonding wire connection to the chip terminals, and an opposite fourth surface. When a coining technique is applied to the lead area, the solderable surface can be enlarged.

The leadframe with the attached chip and wires is encapsulated in a polymeric compound, which is hardened to a package with a fifth surface parallel to the first and second planes. Thereafter, a plurality of recess holes is opened in the package, each hole stretching from the fifth surface to the fourth surface of a respective lead. The recess holes are filled with a solder compound, which attaches to the fourth lead surface. Since solder does not wet plastic package material, surface tension of the correct amount of molten solder will form surfaces reminiscent of an hourglass configuration. The filled solder extends to the fifth package surface; preferably, the solder protrudes slightly from the hole and forms an outward bulge at the fifth package surface. The amount of solder filling the holes is available to mix with external solder at the time of attaching the device to an external board.

The preferred method for opening the holes between the package surface and the leads is by a laser technique. An alternative exemplary method to create the holes to the recessed leads employs inserts added to the chamber of the mold, which have been machined in accordance with the device type to be molded; the inserts hold away molding compound from the solderable lead surface in the third dimension.

DETAILED DESCRIPTION OF THE PREFERRED EMBODIMENTS

Figure 1:
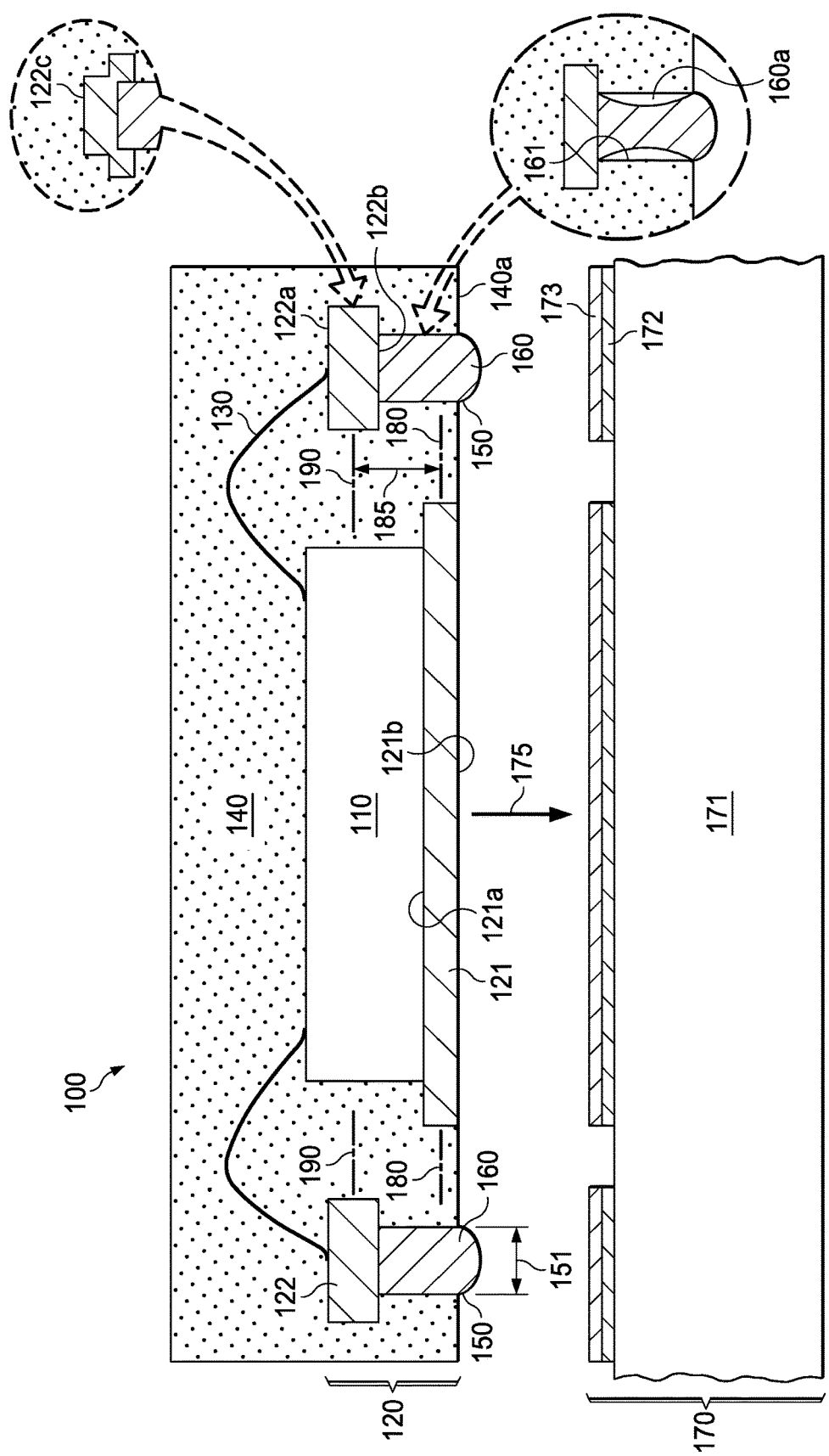
FIG. 1 illustrates a cross section of an embodiment, a packaged semiconductor device with a leadframe having leads recessed relative to the assembly pad and solder-filled holes in the package to contact the leads.

The exemplary embodiment of FIG. 1 shows a plastic packaged semiconductor device 100, which houses a semiconductor chip 110 assembled on a metallic leadframe 120. The leadframe design is generally suitable for Quad Flat No-Lead (QFN) and Small Outline No-Lead (SON) type modules; in other devices, leadframe 120 may include other types of configurations. The preferred base metal of the leadframe includes copper or a copper alloy; alternative metals include aluminum, iron-nickel alloys, and Kovar. Preferred thickness of the leadframe base metal for the exemplary embodiment shown in FIG. 1 is in the range from 0.2 mm to 0.3 mm, other embodiments, however, may use thicker or thinner leadframe metal.

From the standpoint of low cost and batch processing, it is preferred to start with sheet metal and fabricate the leadframe as a strip by stamping or etching. As a consequence of the fact that the starting material is a sheet metal, the leadframe parts are originally in a common plane. When a stamping technique is employed, it can be used both to offset the leads from the original plane and to enlarge the lead areas by coining. It is further practical to flood-plate certain parts of the stamped leadframe with one or more layers of metal in order to achieve certain advantages. For example, the plated metals may promote solder adhesion; a preferred metallurgy includes a layer of nickel followed by a layer of palladium, followed by an outermost layer of gold.

Leadframe 120 includes an assembly pad 121 in a first horizontal plane 180. Pad 121 has a first surface 121a and an opposite second surface 121b. Preferably, first surface 121a has a metallurgy suitable for attaching a semiconductor chip using a polymeric compound, which for many device types is filled with metallic particles, or alternatively with inorganic particles. Second surface 121b preferably has a metallurgy suitable for solder attachment. Leadframe 120 further has a plurality of leads 122 in a second horizontal plane 190, which is parallel to, but offset from plane 180. From first plane 180, the offset 185 of second plane 190 is in the direction of the attached chip 110. Leads 122 preferably have a third surface 122a with a metallurgy suitable for wire bonding (for instance, clad with a silver layer) and an opposite fourth surface 122b preferably with a metallurgy suitable for solder adhesion.

The inset of FIG. 1 illustrates an exemplary pad 122c in order to show how the effective area of pad 122 can be enhanced by a coining technique; in other examples, the direction of area enhancement may be different. As mentioned, the metallurgy of surface 122b has high affinity for solder wetting; consequently, the enlarged contact area of pad 122c will enhance solder adhesion and strengthen the solder joint, after hole 150 has been filled with solder.

As FIG. 1 shows, a semiconductor chip 110 is attached to the first surface 121a assembly pad 121. The terminals of chip 110 are connected by bonding wires 130 to third lead surface 122a; wires 130 are preferably copper or gold.

Device 100 includes a package 140 of plastic material, which encapsulates the leadframe 120, the chip 110 and the bonding wires 130. FIG. 1 illustrates that package 140 has a fifth surface 140a, which is parallel to first plane 180 and second plane 190. In the exemplary embodiment depicted in FIG. 1, second surface 121b of assembly pad 121 is exposed from package 140 and second pad surface 121b is coplanar with the fifth package surface 140a. Furthermore, second pad surface 121b may exhibit a metallurgy suitable for solder adhesion. However, in other embodiments package 140 may fully encapsulate assembly pad 121 including the second pad surface 121b. Even in those devices, fifth package surface 140a still remains parallel to planes 180 and 190; furthermore, leads 122 are more remote from fifth package surface 140a than pad 121.

It is a technical advantage that the recess of leads 122 reduces the length of bonding wires 130, lowering the wire resistance and inductance. It is another technical advantage that the recess of leads 122 creates a lock for the volume of solder 160, which improves the reliability of the solder joints.

Figure 3:
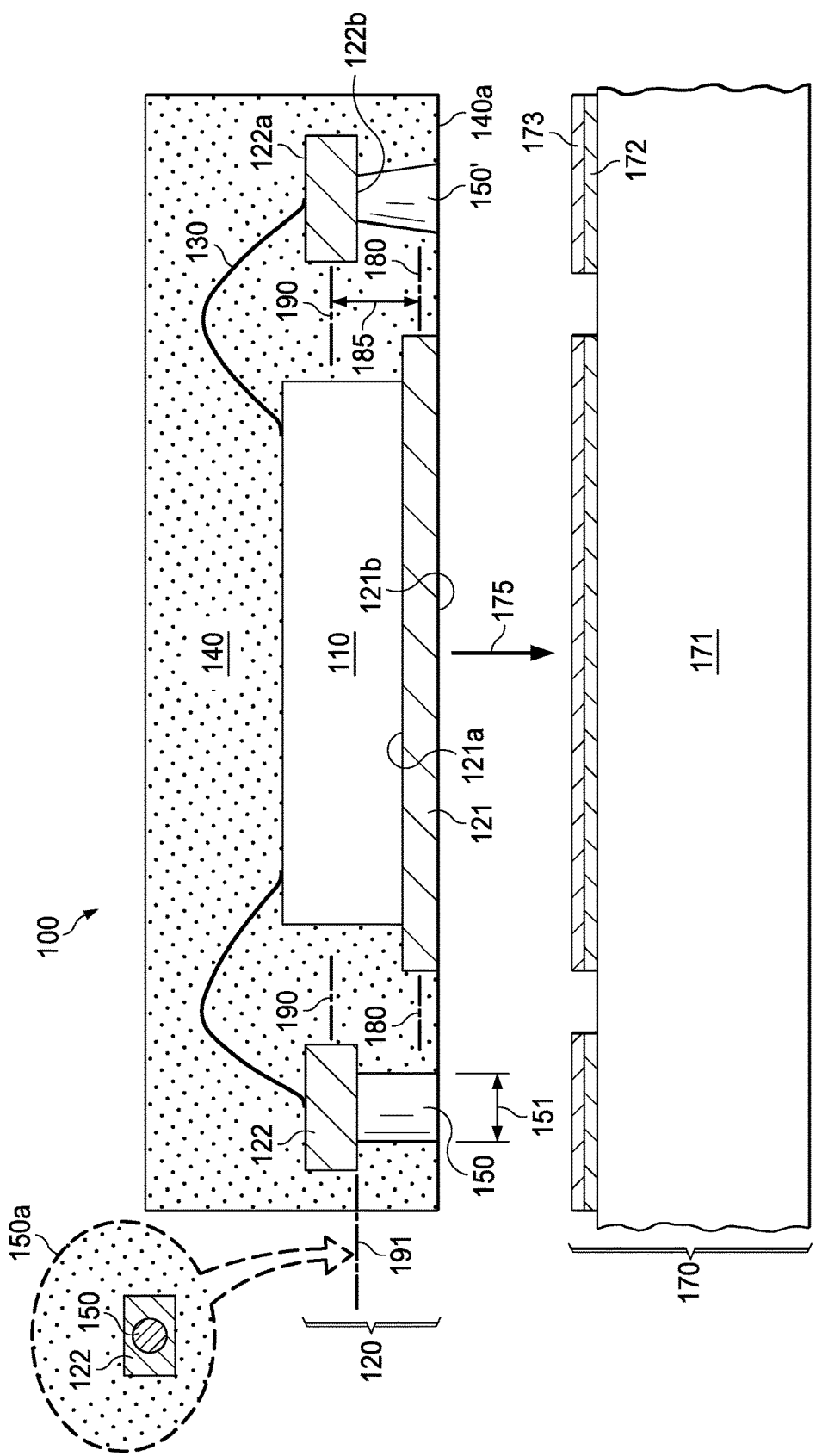
FIG. 3 illustrates a cross section of an embodiment similar to FIG. 1 but showing recesses of different contours.

As FIG. 1 illustrates, package 140 of device 100 has a plurality of recess holes 150, which stretch from the opening 151 at the fifth package surface 140a to the fourth surface 122b of respective leads 122. Dependent on the distance of leads 122 from package surface 140a, recess holes 150 are preferably elongated. The aspect ratio of hole depth 152 to hole diameter 151 depends on the intended method of filling the hole with solder (e.g., solder ball, solder paste, etc.). In a first aspect, a first distance between a plane along the first surface 121*a* and a plane along the opposite second surface 121*b* is less than a second distance between a plane along the package surface 140*a* and a plane along the second opposite lead surface (surface of the lead 122 contacting the recess hole 150). The plane along the second opposite lead surface (surface of the lead 122 contacting the recess hole 150) is within planes between two opposite surfaces of the semiconductor chip 110. In a second aspect, each of the plurality of leads 122 has a second thickness (as shown in FIG. 1) defined by a space between the first lead surface (the surface onto which the wire is connected to as shown in FIG. 1) and the second opposite lead surface (surface of the lead 122 contacting the recess hole 150). A first thickness (as shown in FIG. 1), defined by a space between the first surface 121*a* and the opposite second surface 121*b* of the die attach pad 121, is smaller than the second thickness (as shown in FIG. 1). In a third aspect, a plane along the first lead surface (the surface onto which the wire is connected to as shown in FIG. 1) and a plane along an opposite second lead surface (surface of the lead 122 contacting the recess hole 150) of each of the plurality of leads is within planes between the first chip surface (surface of the chip 110 to which the bond wires are connected to as shown in FIG. 1) and the opposite second chip surface (surface of the chip 110 attached to the pad 121 as shown in FIG. 1). In a fourth aspect, the die attach pad 121 has a first thickness (thickness between 121*a* and 121*b*) and each of the plurality of leads has a second thickness (thickness between the surface onto which the wire is connected to as shown in FIG. 1 and the surface of the lead 122 contacting the recess hole 150), where the first thickness is smaller than the second thickness (as shown in FIG. 1). In a fifth aspect, the package has a second package surface (surface of the packaging compound 140 perpendicular to the surface 140*a* as shown in FIG. 1) perpendicular to the first package surface (140*a*) and each of the plurality of leads 122 is at a distance from the second package surface (as shown in FIG. 1). In a sixth aspect, a first distance between a plane along the package surface 140*a* and a plane along the opposite fourth surface (surface of the chip 110 that is attached to the pad 121) of the semiconductor chip 110 is less than a second distance between the plane along the package surface 140*a* and a plane along the first surface (surface of the lead 122 contacting the recess hole 150) of each of the plurality of leads. In a seventh aspect, each of the plurality of recess holes 150 has a depth (depth of recess hole 150 from the surface of the lead 122 contacting the solder to a plane along the package surface 140*a*) larger than a diameter (diameter as shown in FIG. 3, 150*a*).

Since in one preferred method, recess holes 150 are created by laser ablation of the polymerized package compound, they have an approximately round opening 151 and an approximately cylindrical shape throughout their elongated contour. However, in other devices recess holes 150 may exhibit other cross sections such as approximately square or rectangular, trapezoidal 150', or any other contour (FIG. 3). In addition, FIG. 1 shows that, in first order, elongated recess holes 150 are parallel to each other. FIG. 3 illustrates, in an inset 150*a*, the bottom view of a cross section along line 191. The recess hole 150 has a cylindrical shape throughout the elongated contour.

FIG. 1 shows that recess holes 150 are filled with solder 160. The solder is attached to fourth lead surfaces 122*b* and completely fills the elongated recess holes, at least to the opening 151 at the fifth package surface 140*a*. Preferably, solder 160 protrudes, at least slightly, from hole opening 151 and forms an approximately convex shaped bulge at the fifth package surface. At any rate, the volume of solder contained in each recess hole allows a massive amount of solder 160 to participate in a solder attachment of device 100. The large amount of solder serves as a buffer against transmitting thermomechanical stress to the solder joint at the lead interface and thus acts as a stress-absorbing protection against emerging microcracks at the joint. Consequently, it is the goal to maximize the volume of solder in order to form a robust medium for absorbing thermo-mechanical stress.

Another solder shape for some devices is depicted in an inset of FIG. 1. Since solder does not wet plastic package material, surface tension of the correct amount of molten solder 160*a* can be exploited to acquire the surface outlines reminiscent of an hourglass configuration. In this elongated configuration, a solder connection is especially robust with regard to stress absorption. It is a technical advantage of the recessed hole of the invention that the favorable hourglass configuration can be obtained in BGA-like solder joints without increasing the height of the assembled package and without increasing the needed real estate at the substrate 170.

A slightly bulging contour of the solder filling 160 in the recess holes facilitates the solder attachment of device 100 to an external part 170. The action of attachment is indicated in FIG. 1 by arrow 175. In FIG. 1, exemplary external part 170 is displayed as an insulating substrate 171, which has patterned surface metallizations 172 and 173 matching the terminals of the package. In the example of FIG. 1, the metal of layer 172 is preferably copper, and the metal of layer 173 is screen printed tin or other solder. In the attachment process, device 100 is aligned with substrate 170 so that the bulge of solder 160 touches solder metal 173. When the solder reflow temperature is reached in the attachment process, solder 160 and solder 173 merge and form a massive and robust interconnection.

It is a technical advantage of recessing lead 122 that the connection between device package and board is similar to a standard QFN package low profile and avoids the relatively high standoff height associated with a BGA solder ball package—an advantage in the ongoing market trend for miniaturizing component heights.

As pointed out above, it is another technical advantage that the increased amount of solder in a non-wetting hole offers the opportunity to form an elongated connection 160*a* wherein the solder filling the recess holes has an elongated shape contoured by a center constricted compared to the attachment joints, approximately shaped as an hourglass, for increased stress absorption.

Another embodiment of the invention is a method for fabricating a packaged semiconductor device offering a large amount of solder for ball grid array attachments to external parts. The process flow is summarized in FIG. 2. In process 201, a leadframe strip is provided, which has a plurality of device sites. Each site had an assembly pad and a plurality of leads. The pad has a first surface and an opposite second surface. Preferably, the first surface has a metallurgy suitable for attaching a semiconductor chip using a polymeric compound, and the second surface 121*b* has a metallurgy suitable for solder attachment. The leads have a third surface and an opposite fourth surface. Preferably, the third surface has a metallurgy suitable for wire bonding (for instance, a patterned layer of silver), and the fourth surface has a metallurgy suitable for solder adhesion. As mentioned above, a preferred method for good solder adhesion consists of a layer of nickel on the leadframe base metal followed by a thinner layer of palladium, followed by a very thin layer of gold.

As mentioned above, the leadframe with its assembly pad 121 and its plurality of leads 122 is preferably stamped or etched from a flat sheet of metal in a first horizontal plane 180. As a sheet, the base metal has a top surface and an opposite bottom surface. The subsequent coining step leaves the pad 121 in the first horizontal plane 180 and presses the leads 122 into a parallel second horizontal plane 190 offset from the first plane by distance 185. The coining is performed in a direction so that the bottom surface 122b of the leads (herein called the fourth lead surfaces) faces the top surface 121a of the pad (herein called the first pad surface). The magnitude of the plane offset 185 is determined by the desired size of the recess holes, which will be ablated (see below) into the plastic package compound from the package surface in the first plane in order to reach the recessed leads in the second plane. The bent metal straps, which connect the leadframe parts from the first plane to the second plane, are not shown in FIG. 1.

It has also been mentioned that preferably, first pad surface 121a has a metallurgy suitable for attaching a semiconductor chip, while second pad surface 121b preferably has a metallurgy suitable for solder attachment. The adhesion between copper-based leadframes and epoxy-based chip-attach compounds can be improved by adding design features (e.g., indentations), by roughening, or by chemically modifying (e.g., oxidizing) the leadframe surface.

Leads 122 preferably have a third surface 122a with a metallurgy suitable for wire bonding (for instance, clad with a silver layer) and an opposite fourth surface 122b preferably with a metallurgy suitable for solder adhesion. As mentioned, in a preferred method a layer of nickel is deposited on the leadframe base metal, followed by a thin layer of palladium and an outermost very thin layer of gold.

Figure 2:
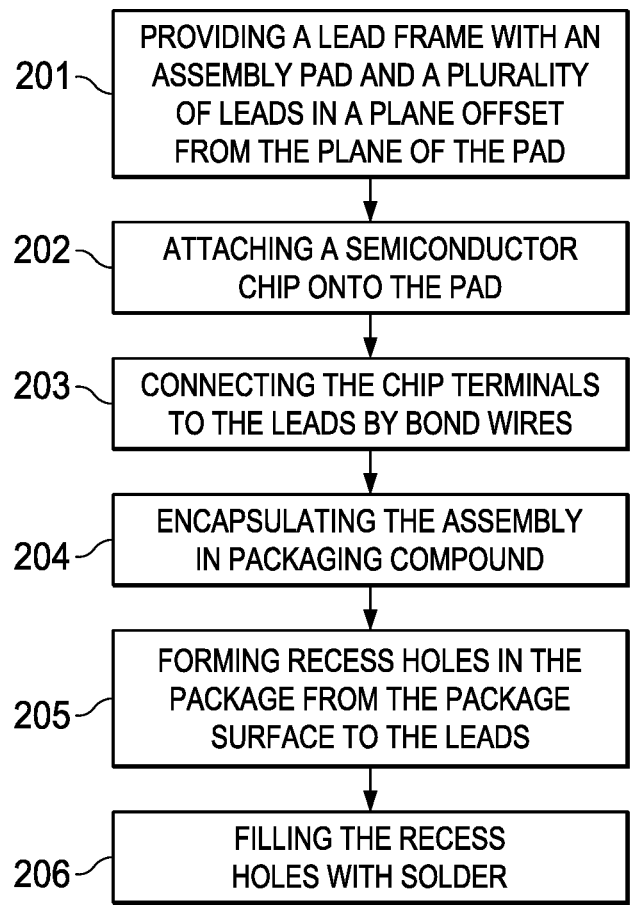
FIG. 2 depicts the flow of processes for fabricating a exemplary semiconductor device as shown in FIG. 1.

After cleaning the leadframe, a semiconductor chip 110 is attached to the first pad surface 121a in process 202 of FIG. 2. After polymerizing the attach compound and another clean-up step, the chip terminals are connected to respective third lead surfaces 122a by bond wires 130, preferably copper or gold (process 203 of FIG. 2) and thereafter the assembly is encapsulated.

The preferred encapsulation method of process 204 is a transfer molding technique. The leadframe strip with its plurality of device sites, with each site having an attached and connected chip, is placed in a steel mold, which forms a cavity around each assembled chip. A semi-viscous thermoset polymeric compound 140 is pressured through runners across the leadframe strip to enter each cavity through a controlling gate. After filling the cavities, compound 140 is allowed to harden by polymerization. In this process, a planar package surface 140a is formed, which is referred to herein as fifth surface; it is remote from first pad surface 121a. In the exemplary device of FIG. 1, package fifth surface 140a is coplanar with pad surface 121b, which remains exposed from the package; in other devices, surface 140a is parallel to but encompasses surface 121b.

In process 205 of FIG. 2, a volume of packaging compound 140 is ablated by a laser process in order to form recess holes 150 with openings of width 151 in the fifth package surface 140a. The holes may have approximately cylindrical contour and stretch from the fifth surface 140a to the fourth surface 122b of respective leads. Holes 150 are preferably elongated; the aspect ratio of hole depth 152 to hole diameter 151 depends on the amount of solder to be expensed for filling the hole and on the intended method of filling the hole, i.e. solder balls vs. solder paste. The laser is operated so that the extended holes 150 are approximately parallel to each other. The laser ablation is followed by a cleaning process.

In an alternative method, holes 150 are created by mold tools. Customized insets are prepared for the assemblies-to-be-encapsulated. The insets are positioned in the cavity of steel molds so that they are aligned with the incoming assemblies to prevent that holes 150 are filled with molding compound. It is preferred to follow the molding step with a cleaning process.

In process 206 of FIG. 2, the recess holes 150 are filled with a solder compound 160. In a preferred technique, solder balls of a predetermined volume of solder are attached to openings 151 so that holes 150 can be filled with liquid solder after the solder reflow temperature is reached. Alternatively, a solder screen printing paste may be used; again, the solder is liquefied at the reflow temperature. Care is taken that holes 150 are completely filled with liquid solder compound so that the solder reaches fourth lead surfaces 122b and is wetting lead surfaces 122b. At the hole openings 151, the solder extends at least to the fifth package surface 140a; it is preferred, however, that the volume of solder compound suffices to protrude from openings 151 and form a convex outward bulge beyond opening 151. It has been shown that the extra solder facilitates a reliable solder attachment to external parts, when solder 160 mixes with external solder.

After cooling down to ambient temperature and solidifying solder 160 in the holes 150, another cleaning process is advisable, followed by an inspection step. The leadframe strip is then singulated, preferably by sawing, into discrete packaged devices.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, and the material of the semiconductor chip may include silicon, silicon germanium, gallium arsenide, or any other semiconductor or compound material used in integrated circuit manufacturing.

As another example, the invention can be applied beyond the assembly of semiconductor devices to the solder attachment of any body with solderable metal terminals, which can be enhanced by recessing the terminals and forming elongated holes in the device package to reach the terminal. The holes extend the contact area for the solder into the third dimension without enlarging the terminal footprint, and provide a generous reservoir for solder mass.

It is therefore intended that the appended claims encompass any such modifications or embodiments.

I claim:
1. A semiconductor device comprising:
a die attach pad including a first surface and an opposite second surface;
a semiconductor chip attached to the die attach pad, the semiconductor chip electrically connected to a plurality of leads, each of the plurality of leads including a first lead surface, a second lead surface opposite to the first lead surface, a third lead surface including a plane parallel to and offset from a plane along the first lead surface, and a fourth lead surface including a plane parallel to and offset from a plane along the second lead surface, the semiconductor chip electrically connected to the first lead surface of each of the plurality of leads; and a packaging compound covering portions of the semiconductor chip, the die attach pad and the plurality of leads forming a package, the opposite second surface of the die attach pad exposed from the package on a package surface, the opposite second surface being coplanar with the package surface;

wherein the packaging compound includes a plurality of recess holes having solder, each of the plurality of recess holes extending from the second lead surface to the package surface, each of the plurality of recess holes including a depth larger than a diameter; and wherein a first distance between a plane along the first surface and a plane along the opposite second surface is less than a second distance between a plane along the package surface and the plane along the second lead surface; and wherein the plane along the second lead surface and a plane along the fourth lead surface are within planes between two opposite surfaces of the semiconductor chip.

2. The device of claim 1, wherein the solder extends beyond the package surface.

3. The device of claim 1, wherein each of the plurality of recess holes has a cylindrical contour.

4. The device of claim 1, wherein at least one of the plurality of recess holes has a conical contour, the conical contour having a plurality of diameters defining the conical contour, each of the plurality of diameters lesser than the depth of each of the plurality of recess holes.

5. The device of claim 1, wherein the solder protrudes from the plurality of recess holes and forms outward bulges.

6. The device of claim 1, wherein the semiconductor chip is electrically connected to the first lead surface of the plurality of leads via a plurality of bonding wires.

7. The device of claim 1, wherein each of the plurality of leads include a second thickness defined by a space between the first lead surface and the second lead surface, and wherein a first thickness, defined by a space between the first surface and the opposite second surface of the die attach pad, is smaller than the second thickness.

8. The device of claim 1, wherein the solder occupies an entire volume of each of the plurality of recess holes.

9. The device of claim 1, wherein a third distance between a plane along the first surface and the plane along the opposite second surface is less than a fourth distance between the plane along the package surface and the plane along the second lead surface.

10. The device of claim 1, wherein the third lead surface includes a plane parallel to and below the plane along the first lead surface, and the fourth lead surface includes a plane parallel to and below the plane along the second lead surface.

11. A semiconductor device comprising:
a die attach pad;
a semiconductor chip attached to the die attach pad and electrically connected to a plurality of leads, the semiconductor chip including a first chip surface and an opposite second chip surface, the opposite second chip surface attached to the die attach pad;
a packaging compound covering portions of the semiconductor chip, the die attach pad and the plurality of leads forming a package, a surface of the die attach pad exposed from the package on a first package surface; and a plurality of recess holes having a conductive adhesive, each of the plurality of recess holes extending from a first lead surface of each of the plurality of leads to the first package surface;

wherein a plane along the first lead surface, a plane along a second lead surface, a plane along a third lead surface parallel to an offset from the first lead surface, and a plane long a fourth lead surface parallel to and offset from the second lead surface of each of the plurality of leads are within planes between the first chip surface and the opposite second chip surface.

12. The device of claim 11, wherein the die attach pad includes a first thickness and each of the plurality of leads includes a second thickness, wherein the second thickness is between the plane along the third lead surface and the plane along the second lead surface, and wherein the first thickness is smaller than the second thickness.

13. The device of claim 11, wherein the package includes a second package surface perpendicular to the first package surface and each of the plurality of leads is at a distance from the second package surface.

14. The device of claim 11, wherein the conductive adhesive extends beyond the first package surface and forms an outward bulge.

15. The device of claim 11, wherein the conductive adhesive fills an entire volume of each of the plurality of recess holes.

16. The device of claim 11, wherein each of the plurality of recess holes includes a depth larger than a diameter, and wherein the conductive adhesive is solder.

17. A semiconductor device comprising:
a lead frame including a die attach pad, the die attach pad including a first surface and an opposite second surface;
a semiconductor chip attached to the die attach pad and electrically connected to a plurality of leads, each of the plurality of leads including a first lead surface, a second lead surface opposite to the first lead surface, a third lead surface and a fourth lead surface opposite to the third lead surface, wherein a plane along the third lead surface is below a plane along the first lead surface, and a plane along the fourth lead surface is below a plane along the second lead surface, the semiconductor chip including a third surface and an opposite fourth surface, the opposite fourth surface of the semiconductor chip attached to the first surface of the die attach pad;
a packaging compound covering portions of the semiconductor chip, the die attach pad and the plurality of leads forming a package, the opposite second surface of the die attach pad exposed from the package on a package surface, the opposite second surface being coplanar with the package surface; and
a plurality of recess holes having a conductive adhesive, each of the plurality of recess holes extending from a first surface of each of the plurality of leads to the package surface;
wherein a first distance between a plane along the package surface and a plane along the opposite fourth surface of the semiconductor chip is less than a second distance between the plane along the package surface and the plane along the third lead surface of each of the plurality of leads.

18. The device of claim 17, wherein the outward bulge is adapted to engage with a portion of a substrate.

19. The device of claim 17, wherein each of the plurality of recess holes includes a depth larger than a diameter.

20. The device of claim 17, wherein the conductive adhesive is solder and the solder extends beyond the package surface forming an outward bulge.

\* \* \* \* \*